United States Patent [19]
Cecchi et al.

[11] Patent Number: 4,866,308
[45] Date of Patent: Sep. 12, 1989

[54] CMOS TO GPI INTERFACE CIRCUIT

[75] Inventors: Delbert R. Cecchi; Hyung S. Kim; John S. Mitby, all of Rochester; David P. Swart, Pine Island; Balsha R. Stanisic, Rochester, all of Minn.; Philip T. Wu, Wappinger Falls, N.Y.

[73] Assignee: International Business Machines Corporation, Armonk, N.Y.

[21] Appl. No.: 179,699

[22] Filed: Apr. 11, 1988

[51] Int. Cl.⁴ .................. H03K 17/16; H03K 19/094; H03K 19/017
[52] U.S. Cl. ..................................... 307/475; 307/443; 307/451; 307/543; 307/546
[58] Field of Search ............... 307/443, 448, 451, 475, 307/546, 543

[56] References Cited

U.S. PATENT DOCUMENTS

| | | | |
|---|---|---|---|
| 4,255,670 | 3/1981 | Griffith | 307/473 |
| 4,454,432 | 6/1984 | Wood | 307/456 |
| 4,472,647 | 9/1984 | Algood et al. | 307/475 |
| 4,477,741 | 10/1984 | Moser, Jr. | 307/473 |
| 4,527,078 | 7/1985 | Smith | 307/475 |
| 4,538,076 | 8/1985 | Shimada | 307/475 |
| 4,563,601 | 1/1986 | Asano et al. | 307/475 |
| 4,593,212 | 6/1986 | Svager | 307/475 |
| 4,704,549 | 11/1987 | Sanwo et al. | 307/475 |
| 4,760,292 | 7/1988 | Bach | 302/443 |

FOREIGN PATENT DOCUMENTS

| | | | |
|---|---|---|---|
| 0555649 | 11/1981 | Japan | 307/475 |
| 0200821 | 9/1987 | Japan | 307/448 |

OTHER PUBLICATIONS

IBM Tech. Disc. Bul., vol. 30, No. 2, Jul. 1987, "CMOS Driver Circuit".
IBM Tech., Disc. Bul., vol. 29, No. 4, Sep. 1986, "CMOS Driver with Output Level Control".
IBM Technical Disclosure Bulletin, vol. 30, No. 2, Jul. 1987, pp. 770–771.
IBM Technical Disclosure Bulletin, vol. 29, No. 4, Sep. 1986, pp. 1760–1761.
IBM Technical Disclosure Bulletin, vol. 30, No. 6, Nov. 1987, pp. 66–67.
IBM Technical Disclosure Bulletin, vol. 29, No. 11, Apr. 1987, pp. 4929–4930.
IBM Technical Disclosure Bulletin, vol. 29, No. 4, Sept. 1986, p. 1697.
IBM Technical Disclosure Bulletin, vol. 29, No. 1, Jun. 1986, pp. 296–297.

Primary Examiner—Stanley D. Miller
Assistant Examiner—M. Wambach
Attorney, Agent, or Firm—Curtis G. Rose

[57] ABSTRACT

A high speed, high performance CMOS to GPI interface circuit is disclosed. The interface circuit contains an input stage, clamping circuitry, an output stage and feedback circuitry. The clamping circuitry clamps the voltage level presented to the output stage at a level below the power supply voltage when the input from the CMOS circuit is at a high logic level. As the voltage level of the signal presented to the CPI circuitry rises, feedback circuitry feeds this signal back to the clamping circuitry, which in turn decreases the voltage level presented to the output stage. This assures the signal presented to the GPI circuit falls within the specified voltage level from 1.51 and 2.2 volts. The feedback circuitry contains a single pole filter that filters out high frequency reflections presented to the feedback circuitry, and a slew rate limiter that slows the rise and fall of the voltage level presented to the output stage thereby reducing noise on the power supply and ground lines. The feedback circuitry uses bilateral (push-pull) gain techniques to control the voltage level presented to the output stage as the input signal from the CMOS circuit swings from low to high logic levels. The interface circuit is made up exclusively from standard threshold FETs. The interface circuit also contains discharge circuitry that discharges the voltage level of the feedback circuitry when the input from the CMOS circuit changes from a high level to a low level, thereby preventing a latch-up condition.

8 Claims, 4 Drawing Sheets 4,866,308

CMOS TO GPI INTERFACE CIRCUIT

FIELD OF THE INVENTION

This invention relates to the data processing field. More particularly, this invention is an interface circuit for interfacing between a CMOS logic circuit and a GPI logic circuit.

A CMOS logic circuit is typically powered by a supply voltage of between 3 and 5 volts. When the output of the CMOS logic circuit is high (logic level "1"), the output voltage will approach the power supply voltage of between 3 and 5 volts. When the output of the CMOS logic circuit is low (logic level "0"), the output voltage will be near 0 volts. Therefore, a relatively large voltage range between a low logic level and a high logic level is provided in the CMOS circuitry. In addition, a liberal voltage range is allowed between the least positive high level voltage and the most positive high level voltage of 3–5 volts.

A GPI circuit, however, has much more stringent high level voltage requirements than a CMOS logic circuit. The low logic level in a GPI circuit is approximately 0 volts, just like in CMOS logic, but the high logic level in the GPI circuit must be in a narrow range between 1.51 and 2.20 volts.

Although several references have disclosed interface circuits between CMOS and other technologies, such as TTL or ECL, these interface circuits are not able to meet the stringent requirements of a CMOS to GPI interface circuit. A few references have attempted to disclose a suitable CMOS to GPI interface circuit. One such attempt is disclosed in the IBM Technical Disclosure Bulletin, Vol. 29, No. 4, September 1986, pp. 1760–1761 to I. W. Kim. I. W. Kim discloses a CMOS to GPI interface circuit that uses, in addition to FETs, non-standard CMOS elements such as resistors and capacitors. This is undesirable as it makes it more difficult to accurately control the high level output voltage. This us of non-standard elements would make the circuit very difficult to manufacture to tolerances necessary for proper operation. Although I. W. Kim discloses a feedback path, it is unable to control a valid high level when a typical overshoot occurs. In addition, the feedback path lacks any filtering or slew rate control which are highly desirable features in achieving a high performance interface circuit capable of driving reflective loads.

A second IBM Technical Disclosure Bulletin, Vol. 30, No. 2, July 1987, pp. 770–771 to Mitby et al also discloses a CMOS to GPI interface circuit. The circuit of Mitby et al is desirable in that it contains only FETs and not any non-standard elements such as the resistors and capacitors in the I. W. Kim circuit. In addition, Mitby et al's feedback path contains double pole filtering circuitry, unilateral (N FET only) gain, and a slew rate control, all desirable in the design of an interface circuit. While Mitby et al discloses a CMOS to GPI interface circuit, it does not achieve high performance (high speed, low cost) with a minimum number of circuit elements. In addition, Mitby et al's circuit requires 9 low threshold FETs for proper operation. Low threshold FETs require non-standard CMOS processing and are very difficult to reliably produce. Finally, Mitby et al's circuit has a latch-up susceptibility which can cause catastrophic failures of the chip.

SUMMARY OF THE INVENTION

It is the principle object of the invention to provide for a low cost high performance high speed CMOS to GPI interface circuit.

It is another object of the invention to reduce the number of circuit components required in the high performance CMOS to GPI interface circuit.

It is another object of the invention to provide a feedback path having bilateral gain.

It is still another object of the invention to provide a feedback path having improved filtering and slew rate control.

It is another object of the invention to use only standard threshold FETs produced in standard CMOS processes.

It is another object of the invention to include discharge circuitry to prevent latch-up.

These and other objects are accomplished by the CMOS to GPI interface circuit disclosed herein. The interface circuit contains an input stage, clamping circuitry, an output stage and feedback circuitry. The clamping circuitry clamps the voltage level presented to the output stage at a level below the power supply voltage when the input from the CMOS circuit is at a high logic level. As the voltage level of the signal presented to the GPI circuitry rises, feedback circuitry feeds this signal back to the clamping circuitry, which in turn decreases the voltage level presented to the output stage. This assures the signal presented to the GPI circuit falls within the specified voltage level from 1.51 and 2.2 volts. The feedback circuitry contains a single pole filter that filters out high frequency reflections presented to the feedback circuitry, and a slew rate limiter that slows the rise and fall of the voltage level presented to the output stage thereby reducing noise on the power supply and ground lines. The feedback circuitry uses bilateral (push-pull) gain techniques to control the voltage level presented to the output stage as the input signal from the CMOS circuit swings from low to high logic levels. The interface circuit is made up exclusively from standard threshold FETs. The interface circuit also contains discharge circuitry that discharges the voltage level of the feedback circuitry when the input from the CMOS circuit changes from a high level to a low level, thereby preventing a latch-up condition.

DESCRIPTION OF THE PREFERRED EMBODIMENT

Figure 1:
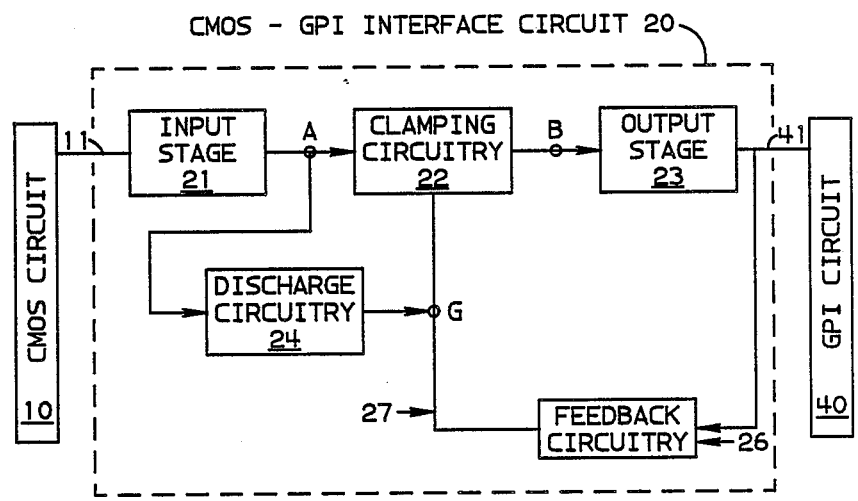
FIG. 1 shows a block diagram of the CMOS to GPI interface circuit of the invention connected between a CMOS circuit and a GPI circuit.

FIG. 1 shows an overall block diagram of the CMOS to GPI interface circuit of the invention. CMOS circuit 10 is connected to interface circuit 20 via input line 11. Likewise, GPI circuit 40 is connected to interface circuit 20 via output line 41. Typically, multiples of CMOS circuit 10, interface circuit 20 and GPI circuit 40 would be used to make up a bus of several parallel data paths. In this case, interface circuit 20 described herein would be duplicated once for every data path on the bus. GPI is an acronym from "General Purpose Interface", and is a set of digital electronic interface voltages used in some IBM products. It is a corollary to the industry standard TTL and ECL interface voltages. In GPI circuits, a logical ZERO is represented by a 'Down' level voltage. The Most Positive Down Level Voltage is 0.9 volts. The Least Positive Down Level Voltage is 0.0 volts. A logical ONE is represented by an 'Up' level voltage. The Most Positive Up Level Voltage is 2.2 volts. The Least Positive Up Level Voltage is 1.5 volts.

The functional blocks of interface circuit 20 will now be described in more detail. Input line 11 from CMOS circuit 10 is connected to input stage 21. Input stage 21 is connected through node A to clamping circuitry 22. Clamping circuitry 22 is connected to output stage 23 through node B. Output stage 23 is connected to output line 41, which is connected to GPI circuit 40. Feedback circuitry 26 is connected to GPI circuit 40, output stage 23, and clamping circuitry 22, providing feedback path 27 which is necessary to maintain an accurate high level voltage at output line 41. Discharge circuitry 24 is connected to feedback path 27 to prevent path 27 from floating to a negative voltage during a low logic level at input line 11.

Figure 2:
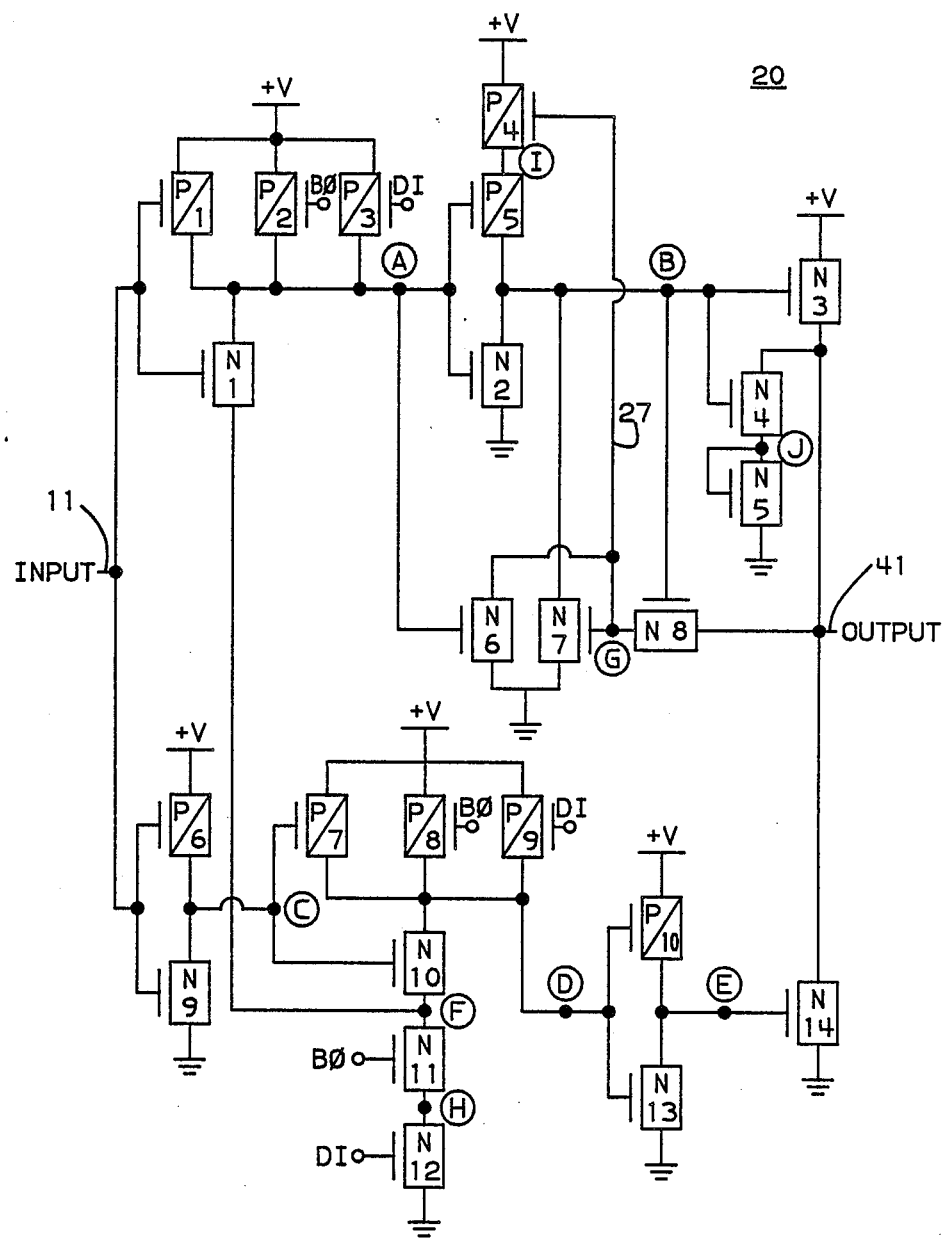
FIG. 2 shows the high speed, high performance CMOS to GPI interface circuit of the preferred embodiment.
Figure 3:
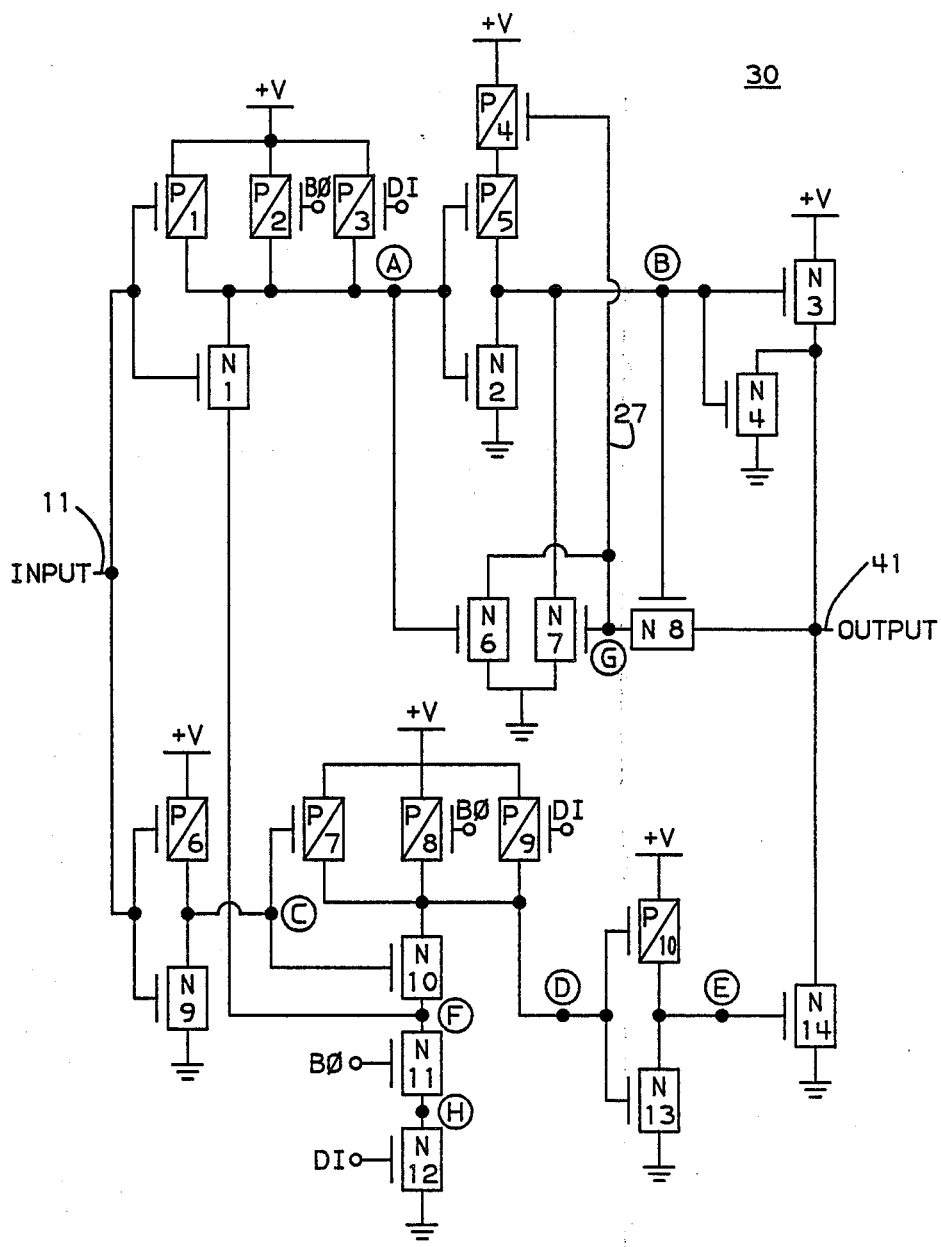
FIG. 3 shows a lower speed, high performance CMOS to GPI interface circuit of the alternate embodiment.

FIG. 2 shows high performance high speed interface circuit 20 of the preferred embodiment. Note that interface circuit 20 is made up exclusively from standard threshold FETs and no components such as resistors or capacitors. Input stage 21 consists of nine P-channel FETs: P1, P2, P3, P5, P6, P7, P8, P9, and P10, and seven N-channel FETs: N1, N2, N9, N10, N11, N12 and N13. Input stage 21 is connected to clamping circuitry 22 which is made up of one P-channel FET: P4, and three N- channel FETs: N4, N5 and N7. Clamping circuitry 22 is connected to output stage 23. Output stage 23 consists of two N-channel FETs: N3 and Nl4. Output stage 23 is connected to output line 41. Feedback circuitry 26 connects output stage 23 to clamping circuitry 22. Feedback circuitry 26 consists of one P-channel FET: P4, and two N-channel FETs: N7 and N8. Note that FETs P4 and N7 are also components of clamping circuitry 22. They perform dual functions. Discharge circuitry 24 is connected between node A and Node G and consists of one N-channel FET: N6.

OPERATION

The operation of interface circuit 20 will now be discussed in more detail. Interface circuit 20 is active when power is supplied to the supply rail +V and when B0 and DI are enabled. In the preferred embodiment, DI is only used for wafer testing. In normal operation, DI is tied to the +V supply line and is therefore always enabled. With B0 enabled, and input line 11 at a low logic level (indicating a binary 0 input from CMOS circuit 10), FET P1 is turned on and node A is at the +V voltage level of, in the preferred embodiment, 5 volts. When node A is high, FETs N2 and N6 are turned on, thus providing a discharge path for node B and node G. Simultaneously, FET P6 is turned on and node C rises, causing node D to fall and node E to rise. As node E rises, FET Nl4 turns on, pulling down output line 41.

Discharge circuitry 24 prevents the falling voltage at node B from coupling from the drain to gate of FET N7 and driving node G to a voltage negative with respect to ground. If this were permitted to occur, latch-up can result, because the N-type source of FET N8 is also driven below ground and will conduct current to the chip's substrate, causing latch-up. Latch-up in a chip can cause catastrophic failure of the chip. Discharging node G to ground ensures that the voltage at node G will never drop below ground. Hence, latch-up immunity is preserved by the action of FET N6, the component of discharge circuitry 24.

With interface circuit 20 enabled and input line 11 at a high logic level (indicating a binary 1 from CMOS circuit 10), node A is forced low, thereby turning on FET P5. Current supplied through FETs P4 and P5 to FET N3 forces the voltage at node B and output line 41 to rise. As node B rises two threshold voltages above ground, FETs N4 and N5 start to conduct, enabling them to clamp any overshoot that might occur on output line 41. As the output voltage on output line 41 rises, the voltage level of node G will rise, causing FET P4 to conduct less current and FET N7 to conduct more current. This is the bilateral gain effect mentioned previously. In this manner, the voltage level of node B is clamped, thereby holding the voltage level of output line 41 within the parameters required by GPI circuit 40.

The gate to substrate inversion layer capacitance of FET N8 is used to slow the voltage rise and fall at node B. In this manner, FET N8 acts as a slew rate limiter for interface circuit 20. This will reduce the amount of noise generated on the power supply and ground lines due to rapid switching of input line 11.

The capacitances of FETs N8, N7, N6 and P4 form a large capacitance at node G. Together with the high on-resistance of N8, this capacitance forms a single pole filter. This filter filters out high frequency reflections that are returned by unterminated transmission lines. Line 41 is an unterminated transmission line in many applications of this invention. Eliminating these high frequency reflections is instrumental in eliminating ringing or oscillation in feedback path 27. Using a single pole filter instead of a double pole filter increases the speed of the interface circuit and decreases the cost of the circuit, since fewer components are required. The maximum propagation delay of interface circuit 20 is approximately 25 nanoseconds.

Note that feedback circuitry 26 adjusts the voltage at node B using bilateral gain techniques as a function of the voltage on output line 41. As the voltage on output line 41 is coupled back through FET N8 to the gates of FETs P4 and N7, the resistances of FETs P4 and N7 are modified by the feedback voltage at node G. If the voltage level at node G is high, FETs P4 and N7 provide the linear gain necessary to lower the voltage level at node B. If the voltage level at node G is low, FETs N7 and P4 provide the linear gain necessary to raise the voltage at node B. Thus FETs P4, P5 and N7 act as a voltage divider that adjusts the voltage at node B as a function of the voltage at output line 41.

The high performance, lower speed interface circuit 30 of the alternate embodiment will now be discussed. Note that interface circuit 30 is identical to interface circuit 20 of the preferred embodiment except that FET N5 is not present. Instead, FET N4 is tied directly to ground. Interface circuit 30 operates in a similar manner to interface circuit 20 of the preferred embodiment except that when input line 11 switches to a high logic level (thereby forcing node A low and node B high), node B only rises one threshold voltage level above ground instead of two threshold voltage levels above ground in the preferred embodiment before FET N4 starts to discharge the output voltage on output line 41.

Figure 4:
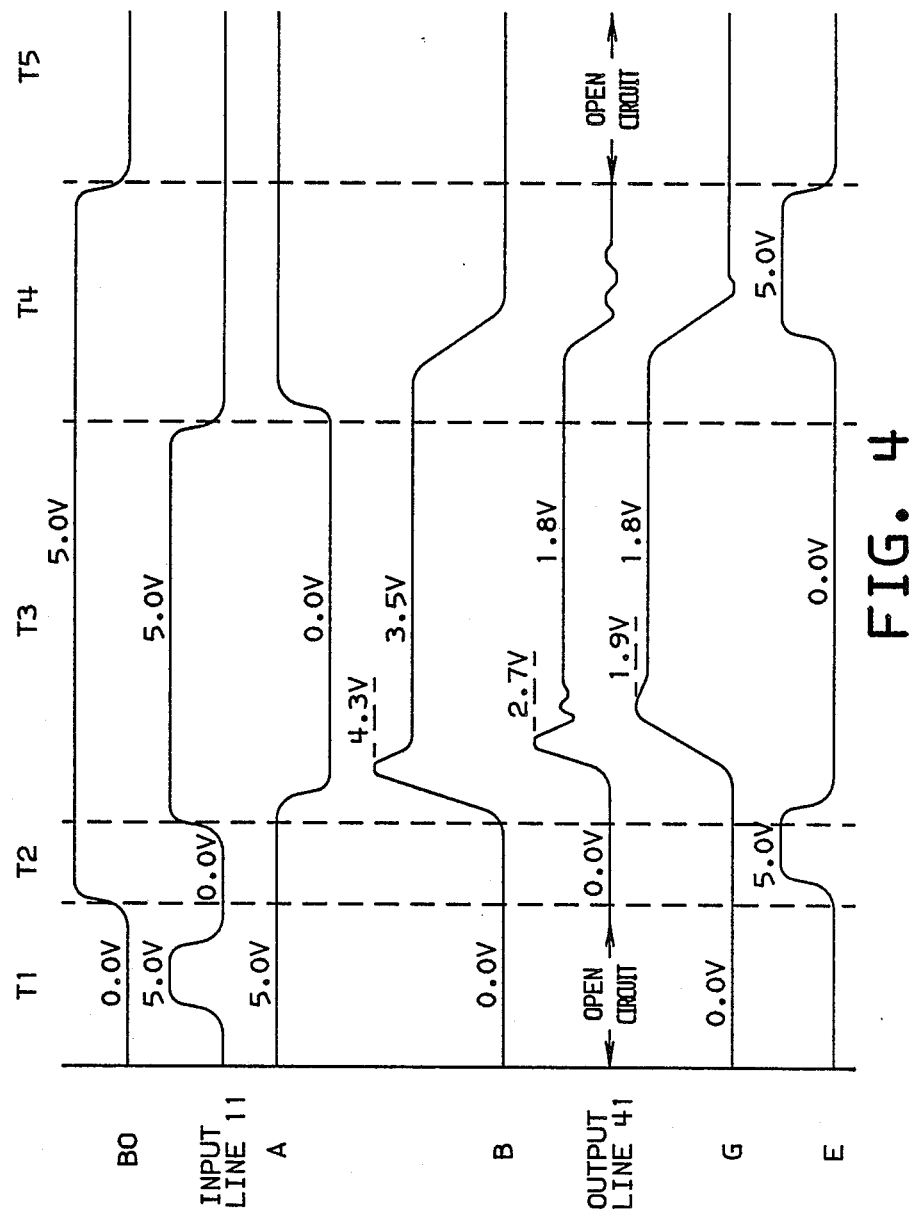
FIG. 4 shows a timing diagram in the CMOS to GPI interface circuit of the preferred embodiment.

The timing diagram of interface circuit 20 is shown in FIG. 4. In time period T1, interface circuit 20 presents a high impedance to output line 41, since line B0 is low.

In time period T2, line B0 goes high thereby enabling interface circuit 20 to drive voltage to output line 41. Input line 11 is low thereby keeping node A high and node B low. Output line 41 is also low, since node E is high and FET Nl4 has been turned on. Node G is low indicating lack of activity in feedback path 27.

In time period T3, input line 11 goes high, indicating a binary 1 from CMOS circuit 10. Node A goes low, overdriving node B high (to about 4.3 volts). Output line 41 feedback path 27 to go high and activate clamping also goes high (to about 2.7 volts), forcing node G in circuitry 22. The voltage on node B is then reduced (clamped) from the high of approximately 4.3 volts down to 3.5 volts. This reduces the voltage on output line 11 from 2.7 volts to 1.8 volts, appropriate for a high level voltage of GPI circuit 40. This level is held relatively constant by the activity of feedback path 27.

In time period T4, input line 11 drops back to a low level, indicating a binary 0 from CMOS circuit 10. This forces node A high, node B low, node E high, node G low and output line 41 low, thereby returning all of the levels back to where they were in time period T2.

In time period T5, line B0 is low, indicating that interface circuit 20 has been returned to the high impedance state of time period T1. Output line 41 shows an open circuit to GPI circuit 40.

While the invention has been described with respect to a preferred embodiment and an alternate embodiment, it will be understood by those skilled in the art that various changes in detail may be made therein without departing from the spirit, scope and teaching of the invention. Accordingly, the herein disclosed is to be limited only as specified in the following claims.

What is claimed is:

1. A CMOS to GPI interface circuit having an input stage connected to a CMOS circuit and an output stage connected to a GPI circuit, said interface circuit comprising:
    clamping means, connected between said input stage and said output stage, for clamping the voltage level appearing at a first node between said output stage and said clamping means below the voltage level of said single power supply when the voltage level from said CMOS circuit is high;
    feedback means, connected to said output stage, said clamping means and said GPI circuit, for bilaterally adjusting the voltage level of said first node as a function of the voltage level of the signal presented to said GPI circuit, said feedback means further comprising:
    single pole filtering means for filtering out high frequency reflections; and
    slew rate limiting means for slowing the rise and fall of the voltage level at said first node, said rise and fall responsive to respective high and low voltage levels of said CMOS circuit.

2. The interface circuit of claim 1, further comprising:
    discharge means, connected to said feedback means, said input stage and said clamping means, for discharging the voltage level of said feedback means when said CMOS circuit changes from a high voltage level to a low voltage level.

3. The interface circuit of claim 2, wherein said clamping means further comprises:
    a first FET connected to said output stage and said first node;
    a second FET connected to said input stage and said single power supply; and
    a third FET connected to said first FET, said second FET, and said first node.

4. The interface circuit of claim 3, wherein said feedback means further comprises:
    said second FET;
    said third FET; and
    a fourth FET connected to said output stage, said GPI circuit, said first node, said first FET, said second FET and said third FET.

5. The interface circuit of claim 4, wherein said discharge means further comprises:
    a fifth FET connected to said input stage, said second FET, said third FET, and said fourth FET.

6. The interface circuit of claim 5, wherein said clamping means further comprises:
    a sixth FET connected to said first FET.

7. The interface circuit of claim 6, wherein said first FET, said second FET, said third FET, said fourth FET, said fifth FET and said sixth FET are all standard threshold FETs.

8. The interface circuit of claim 7, wherein said interface circuit has a maximum propagation delay of approximately 25 nanoseconds.

* * * * *